July 18, 1967 H. C. KLING ETAL 3,331,997

SILICON DIODE WITH SOLDER COMPOSITION ATTACHING OHMIC CONTACTS

Filed Dec. 31, 1964

INVENTORS
HARRY C. KLING
BY EDMUND KOSLOSKY
Eyre, Mann & Lucas
ATTORNEYS

United States Patent Office 3,331,997
Patented July 18, 1967

3,331,997

SILICON DIODE WITH SOLDER COMPOSITION ATTACHING OHMIC CONTACTS

Harry C. Kling, Morristown, and Edmund Koslosky, Livingston, N.J., assignors to Wagner Electric Corporation, a corporation of Delaware Filed Dec. 31, 1964, Ser. No. 422,698
8 Claims. (Cl. 317—234)

ABSTRACT OF THE DISCLOSURE

This invention relates to a silicon diode with ohmic contacts connected to its sides with a solder composed of at least 97% lead by weight, the remainder being silver and tin.

This invention relates to rectifying semiconductor elements. It has particular relationship to a means for attaching silicon rectifiers to copper slabs which act as electrical terminals.

Silicon rectifiers always generate heat when they pass currents of any considerable magnitude and, during the temperature rise, the silicon rectifier expands and the conducting surfaces move in relationship to the terminal blocks. It is convenient and desirable to make the terminal blocks of copper since this element has exceptional conductivity for both electrical currents and heat. Unfortunately, the coefficients of expansion of copper and silicon differ and, if special precautions are not taken, the excessive expansion of copper will pull the silicon apart and produce many cracks in the crystal structure. One method of solving this difficulty is to place molybdenum slabs on both sides of the crystal, secured to the crystal by a thin layer of solder. The molybdenum slabs have approximately the same coefficient of expansion as the silicon crystal so there is no tendency to crack or rupture as the temperature is changed. However, such a construction requires two additional slabs of material and at least four layers of solder. The present invention employs only two layers of solder and omits the molybdenum slabs although, soldering the silicon crystal directly to its copper electrodes. There is no tendency to crack or rupture when the temperature is changed because the solder used has an exceptional cold-flow characteristic and this permits the two surfaces to slide over one another without exerting too much tangential force.

One of the objects of this invention is to provide an improved silicon rectifier structure which avoids one or more of the disadvantages and limitations of prior art arrangements.

Another object of the invention is to reduce the cost of silicon rectifiers.

Another object of the invention is to increase the heat flow from the crystal where it is generated to the copper electrodes and to other parts of the crystal mounting.

Another object of the invention is to permit the operation of silicon rectifiers at a higher current value than would otherwise be possible.

The invention comprises a silicon rectifier crystal soldered between two slabs of copper. The solder comprises 97.5 percent lead, 1.5 percent silver, and 1.0 percent tin. It has been found that this solder possesses the required cold-flow necessary to permit the expansion and contraction of the silicon and copper without rupture. The solder is first rolled into a foil which is .003 inch thick and this foil is deposited between components before a heating operation.

For a better understanding of the present invention, together with other and further objects thereof, reference is made to the following description taken in connection with the accompanying drawings.

Figure 1:
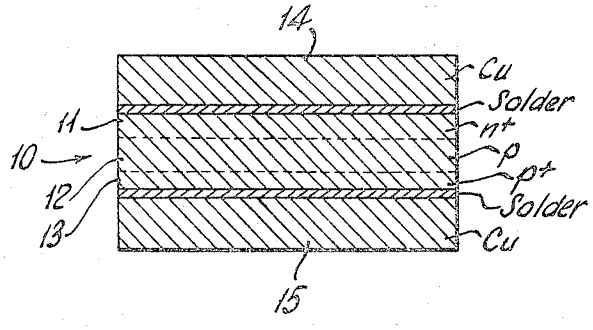
FIG. 1 is a cross sectional view of the silicon rectifier crystal soldered between two copper slabs.

Referring now to the figures, a silicon crystal 10 contains an upper doped zone 11 of n type. A second zone of p type silicon 12 adjoins the first zone and a third zone 13 on the bottom is doped for excessive positive conduction and is shown in the drawing as p+. This is the usual type of silicon rectifier crystal and its characteristics have been described in many publications. A copper slab 14 is mounted above the crystal and a similar copper slab 15 is mounted on the other side. These slabs are soldered to the crystal faces by a solder which is composed of 97.5 percent lead, 1.5 percent silver, and 1.0 percent tin.

Figure 2:
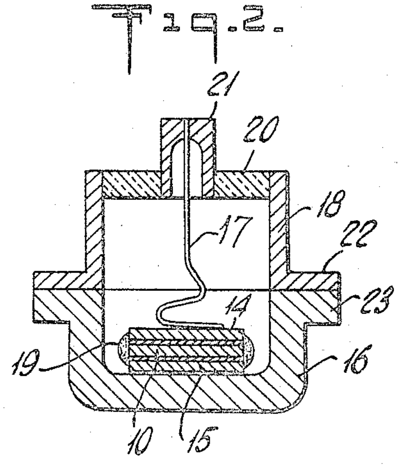
FIG. 2 is a cross sectional view of the silicon rectifier unit enclosed within a copper container.

It has been found convenient to first roll the solder into a foil which is about .003 inch thick. This foil is cut to the same shape as the crystal and then the assembly of crystal, copper slabs and foils of solder are assembled as shown in FIG. 1 and heated in a furnace to a temperature of about 425 degrees centigrade. It has been found convenient to first deposit a very thin plate of nickel on both sides of the silicon and then sinter the silicon crystal for a short time to drive off all the occluded water vapor and other liquid contaminants. The silicon crystal may now be gold plated by an electrolytic gold plating process and then dried. It has been found that the nickel and gold plate on the silicon makes a better bond with the solder. The crystal assembly is now ready for encapsulation. One structure which may be used for enclosing the crystal assembly is shown in FIG. 2. The edges of the crystal have been protected by a coating 19 which may be any type of heat resistant insulator material applied by painting or otherwise depositing a thick solution of an insulator and a solvent to the crystal edge. After drying, the assembly is deposited on the inner surface of a copper cup 16 on a thin foil of solder consisting of 95.0 percent tin, 4.7 percent silver, and 0.3 percent antimony at a temperature of 265 degrees centigrade (approximate). A resilient wire connecter 17 is applied to the upper copper layer 14 of the crystal assembly and an upper cup 18 is added. This cup contains a glass disk 20 for insulation purposes and a central metal tube 21 which is later soldered to wire 17 to form an hermetic and electrical seal. The cups 16 and 18 are formed with flanges 22 and 23 and these flanges may be welded to each other by any of the well known processes. The crystal rectifier is now ready for use. It will be obvious from the above description that this crystal rectifier assembly is simple, easy to manufacture, and the absence of molybdenum disks increases the heat flow to the lower cup 16.

The foregoing disclosure and drawings are merely illustrative of the principles of this invention and are not to be interpreted in a limiting sense. The only limitations are to be determined from the scope of the appended claims.

We claim:

1. In a semiconductor device, in combination, an end contact member of copper, a wafer of silicon having one surface conforming to a surface of the end contact member, the two surfaces being adjacent to each other, and a solder disposed between and bonding the silicon wafer to the end contact member, the solder comprising a lead alloy composed of 97 to 98 parts by weight of lead, 1 to 2 parts of silver, and from 0.5 to 1.5 parts of tin.

2. In a semiconductor device, in combination, a first end contact member of copper, a wafer of silicon having a first surface conforming to a surface of the first end contact member, the two surfaces being adjacent to each other, a first film of solder disposed between and bonding the silicon wafer to the first end contact member, a second end contact member of copper disposed on the other side of the silicon wafer and adjacent to its other surface, and a second film of solder disposed between and bonding the silicon wafer to the second end contact member, the solder in each film comprising a lead alloy composed of 97 to 98 parts by weight of lead, 1 to 2 parts of silver, and from 0.5 to 1.5 parts of tin.

3. A semiconductor diode comprising, in combination, a first end contact member, a first film of solder bonded to the contact member, a P-N junction wafer of silicon having one side bonded to the film of solder, a second film of solder bonded to the other side of the wafer of silicon, and a second end contact member of copper bonded to the second film of solder, the solder in each film comprising a lead alloy composed of 97 to 98 parts by weight of lead, 1 to 2 parts of silver, and from 0.5 to 1.5 parts of tin.

4. A semiconductor diode as claimed in claim 3 further comprising a copper base mount and a third solder having a lower melting point than said films of solder, said third solder being disposed between said base mount and a side of said diode for bonding the diode to the mount.

5. A semiconductor diode as claimed in claim 3 wherein said diode further comprises a protective layer of nonconductive material covering the side edges thereof.

6. A semiconductor diode as claimed in claim 3 wherein the wafer of silicon further comprises a film of gold plated on one side surface thereof.

7. A semiconductor diode comprising, in combination, a first end contact member of copper, a first film of solder bonded to the contact member, a P-N junction wafer of silicon having one side bonded to the film of solder, a second film of solder bonded to the other side of the wafer of silicon, and a second end contact member of copper bonded to the second film of solder, the solder in each film comprising a lead alloy composed of 97 to 98 parts by weight of lead, 1 to 2 parts of silver, and from 0.5 to 1.5 parts of tin, said wafer of silicon including a film of nickel plated on each side surface thereof.

8. A semiconductor diode as claimed in claim 7 wherein said silicon wafer includes a thin film of gold plated on each film of nickel.

References Cited

UNITED STATES PATENTS

| | | | |
|---|---|---|---|
| 2,763,822 | 9/1956 | Frola et al. | 317—234 |
| 2,964,830 | 12/1960 | Henkels et al. | 317—234 X |
| 2,986,678 | 5/1961 | Andres et al. | 317—234 |
| 2,989,578 | 6/1961 | Wagner et al. | 317—234 X |

JAMES D. KALLAM, *Primary Examiner.*